(12) United States Patent
Kim et al.

(10) Patent No.: US 9,520,499 B2
(45) Date of Patent: Dec. 13, 2016

(54) SEMICONDUCTOR DEVICE AND METHOD FOR FABRICATING THE SAME

(71) Applicants: Sung-Min Kim, Incheon (KR); Ji-Su Kang, Seoul (KR); Dong-Kyu Lee, Hwaseong-si (KR); Dong-Ho Cha, Seongnam-si (KR)

(72) Inventors: Sung-Min Kim, Incheon (KR); Ji-Su Kang, Seoul (KR); Dong-Kyu Lee, Hwaseong-si (KR); Dong-Ho Cha, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/867,423

(22) Filed: Sep. 28, 2015

(65) Prior Publication Data

US 2016/0020318 A1 Jan. 21, 2016

Related U.S. Application Data

(63) Continuation of application No. 14/287,240, filed on May 27, 2014, now Pat. No. 9,178,044.

(30) Foreign Application Priority Data

May 30, 2013 (KR) .................. 10-2013-0061775

(51) Int. Cl.
  *H01L 29/78* (2006.01)
  *H01L 29/66* (2006.01)
(52) U.S. Cl.
  CPC ....... *H01L 29/785* (2013.01); *H01L 29/66795* (2013.01)

(58) Field of Classification Search
  CPC ............. H01L 29/66795; H01L 29/785; H01L 27/0886; H01L 2924/0002; H01L 21/823821
  See application file for complete search history.

(56) References Cited

U.S. PATENT DOCUMENTS 6,399,985 B2  6/2002  Horita et al.
7,459,359 B2  12/2008  Park et al.
(Continued)

FOREIGN PATENT DOCUMENTS

KR  1020040074501 A  8/2004
KR  100650773 B1  11/2006
KR  1020080073108 A  8/2008

*Primary Examiner* — Karen Kusumakar
(74) *Attorney, Agent, or Firm* — Myers Bigel, P.A.

(57) ABSTRACT

Provided are a semiconductor device and a method for fabricating the same. The method for fabricating a semiconductor device comprises, providing an active fin and a field insulating film including a first trench disposed on the active fin; forming a second trench through performing first etching of the field insulating film that is disposed on side walls and a lower portion of the first trench; forming a first region and a second region in the field insulating film through performing second etching of the field insulating film that is disposed on side walls and a lower portion of the second trench, the first region is disposed adjacent to the active fin and has a first thickness, and the second region is disposed spaced apart from the active fin as compared with the first region and has a second thickness that is thicker than the first thickness; and forming a gate structure on the active fin and the field insulating film.

20 Claims, 20 Drawing Sheets

(56) References Cited

U.S. PATENT DOCUMENTS

| | | | |
|---|---|---|---|
| 7,655,533 B2 * | 2/2010 | Sheen | H01L 29/66795 257/E21.56 |
| 2005/0282342 A1 * | 12/2005 | Adan | H01L 29/7851 438/294 |
| 2008/0242024 A1 | 10/2008 | Sugioka | |
| 2011/0097889 A1 | 4/2011 | Yuan et al. | |

* cited by examiner

<u>4</u>

SEMICONDUCTOR DEVICE AND METHOD FOR FABRICATING THE SAME

CROSS-REFERENCE TO RELATED APPLICATIONS

This application is based on and claims priority under 35 U.S.C. §120 as a continuation of U.S. patent application Ser. No. 14/287,240, filed May 27, 2014, which in turn claims priority under 35 U.S.C. §119 from Korean Patent Application No. 10-2013-0061775, filed on May 30, 2013 in the Korean Intellectual Property Office, the disclosure of each of which is incorporated herein in its entirety by reference.

BACKGROUND

The present invention relates to a semiconductor device and a method for fabricating the same.

Recently, semiconductor devices such as field effect transistors have been developed that can perform high-speed operations at low voltage, and processes of fabricating semiconductor devices have been developed that exhibit improved integrity. The improved integrity of the semiconductor devices may cause the occurrence of a short channel effect in a field effect transistor. In order to overcome this effect, fin field effect transistors (FinFET) have been developed which have channels that are formed in a 3D spatial structure.

SUMMARY

Embodiments of the present invention provide methods for fabricating semiconductor devices that have improved operation characteristics.

Additional advantages, objects, and features of the invention will be set forth in part in the description which follows and in part will become apparent to those having ordinary skill in the art upon examination of the following or may be learned from practice of the invention.

In one aspect of the present invention, there is provided a method for fabricating a semiconductor device, comprising: providing an active fin and a field insulating film including a first trench on the active fin; etching portions of the field insulating film that define side walls of the first trench to form a second trench; etching a lower portion of the second trench so that a first region of the field insulating film that is disposed adjacent to the active fin has a first thickness, and a second region of the field insulating film that is spaced apart from the active fin as compared to the first region has a second thickness that is thicker than the first thickness; and forming a gate structure on the active fin and the field insulating film.

In another aspect of the present invention, there is provided a method for fabricating a semiconductor device, comprising: providing first and second active fins; forming a field insulating film on the first and second active fins; forming first and second trenches in the field insulating film above the respective first and second active fins; anisotropically etching portions of the field insulating film that are adjacent to the respective first and second active fins and are exposed by the respective first and second trenches to form a first region and a second region in the field insulating film, the first region is disposed adjacent to the first and second active fins and has a first thickness, and the second region is disposed between the first and second active fins and has a second thickness that is thicker than the first thickness; and forming a gate structure on the first and second active fins and the field insulating film.

In another aspect of the present invention, there is provided a semiconductor device comprising: first and second active fins that project from a substrate in a first direction; a field insulating film on the substrate between the first and second active fins; a gate structure on the field insulating film to surround at least parts of the first and second active fins; and a spacer disposed on at least one side of the gate structure, wherein the field insulating film includes a first region that is adjacent to the first and second active fins and has a first thickness, and a second region that is spaced apart from the first and second active fins as compared with the first region and has a second thickness that is thicker than the first thickness, and the gate structure includes a gate insulating film extending in the first direction along side walls of the spacer.

In another aspect of the present invention, there is provided a semiconductor device comprising: first and second active fins that project from a substrate and extending along the substrate in a first direction; a field insulating film disposed between the first and second active fins; a gate structure disposed on the field insulating film and the first and second active fins to extend in a second direction that crosses the first direction; and a source region and a drain region formed at the first active fin adjacent to the gate structure, wherein a thickness of the gate structure that is disposed adjacent to the first and second active fins is larger than a thickness of the gate structure that is disposed in a central region between the first and second active fins, and upper surfaces of the source region and the drain region are formed to be higher above a top surface of the substrate than a lower surface of the gate structure.

Other details of the present invention are included in the detailed description and drawings.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

Figure 1:
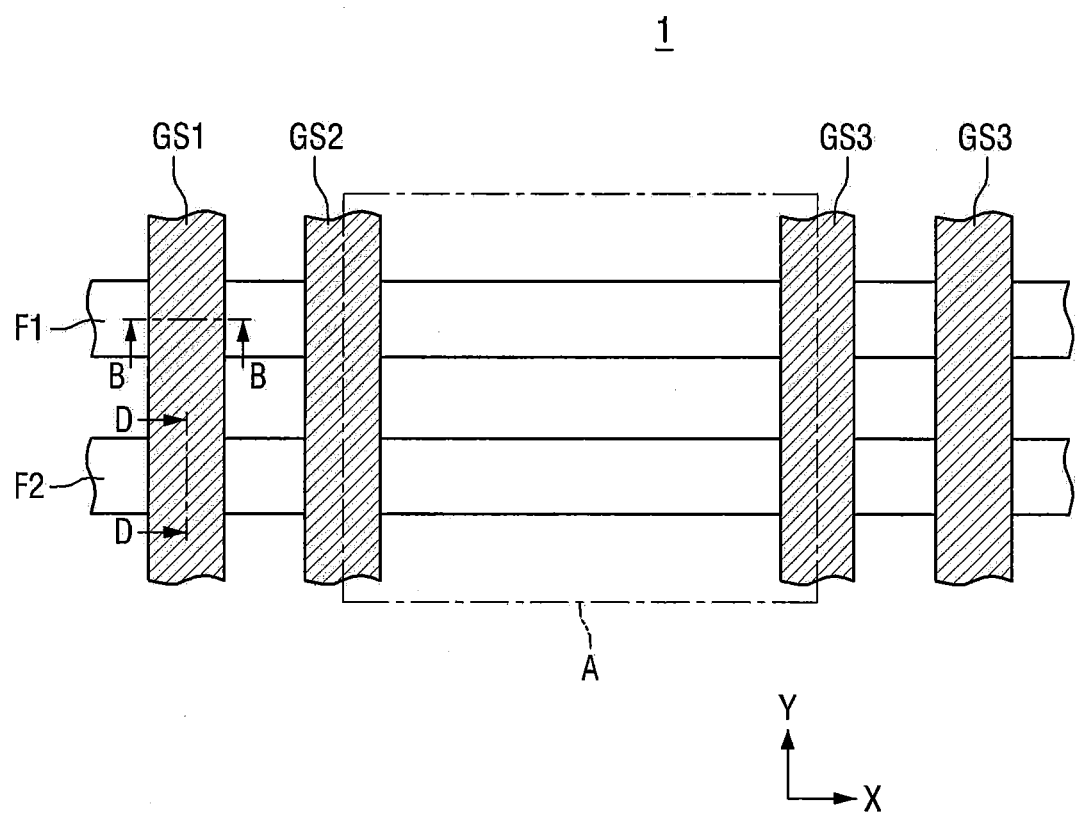
FIG. 1 is a layout diagram illustrating a semiconductor device according to a first embodiment of the present invention.

Advantages and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element or a first component discussed below could be termed a second element or a second component without departing from the teachings of the present invention.

The present invention is described below with reference to perspective views, cross-sectional views, and plan views, in which example embodiments of the invention are shown. It will be appreciated that these views may be modified according to manufacturing techniques and/or allowances. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified.

Hereinafter, example embodiments of the present invention will be described in detail with reference to the accompanying drawings.

Figure 2:
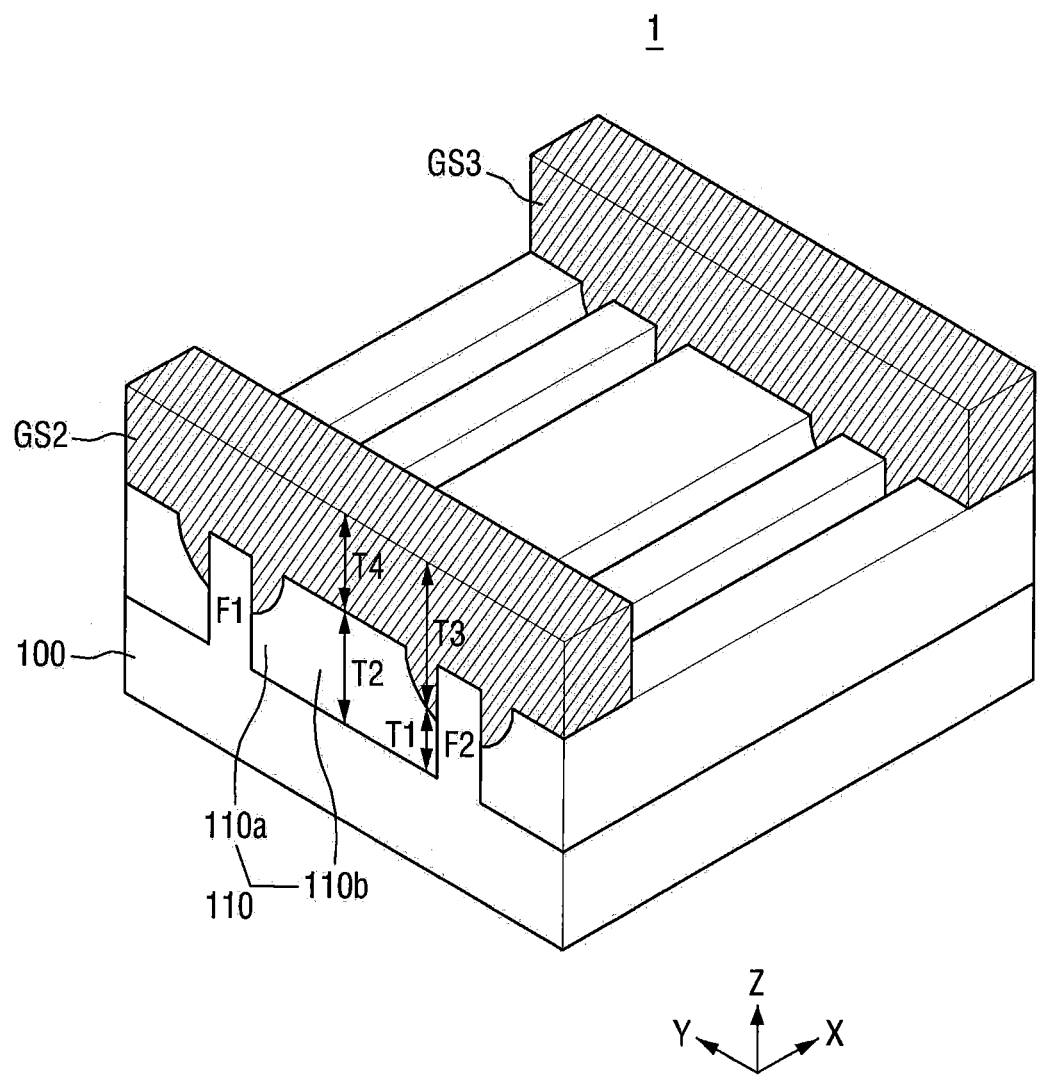
FIG. 2 is a perspective cut-away view of a region A in FIG. 1.
Figure 3:
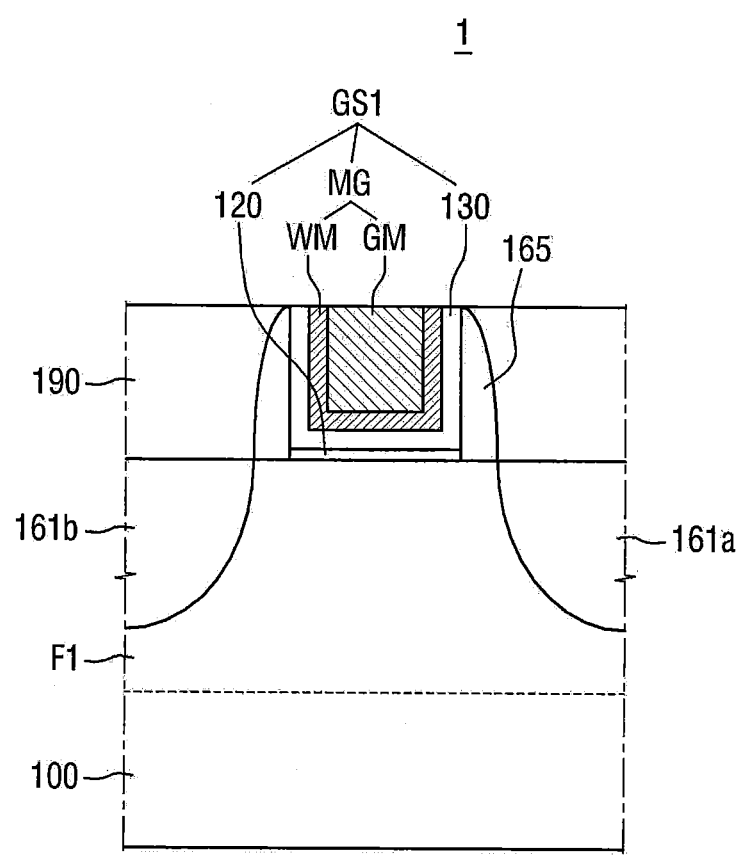
FIG. 3 is a cross-sectional view cut along line B-B in FIG. 1.
Figure 4:
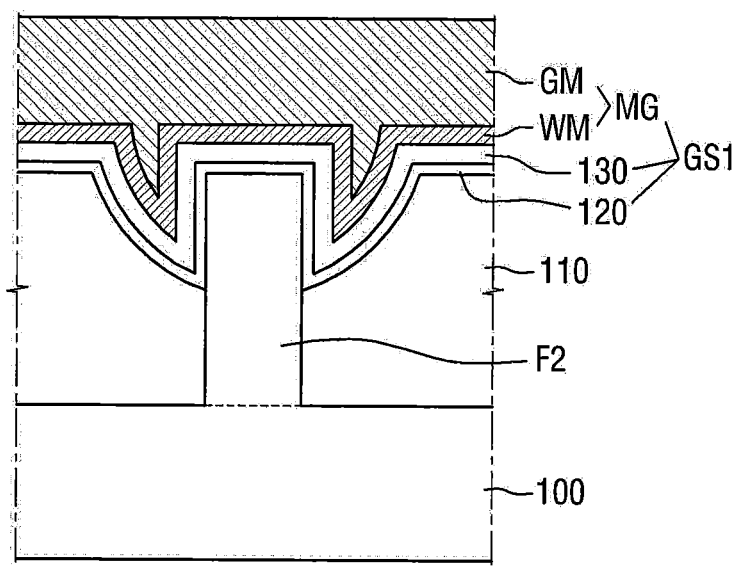
FIG. 4 is a cross-sectional view cut along line D-D in FIG. 1.
Figure 5:
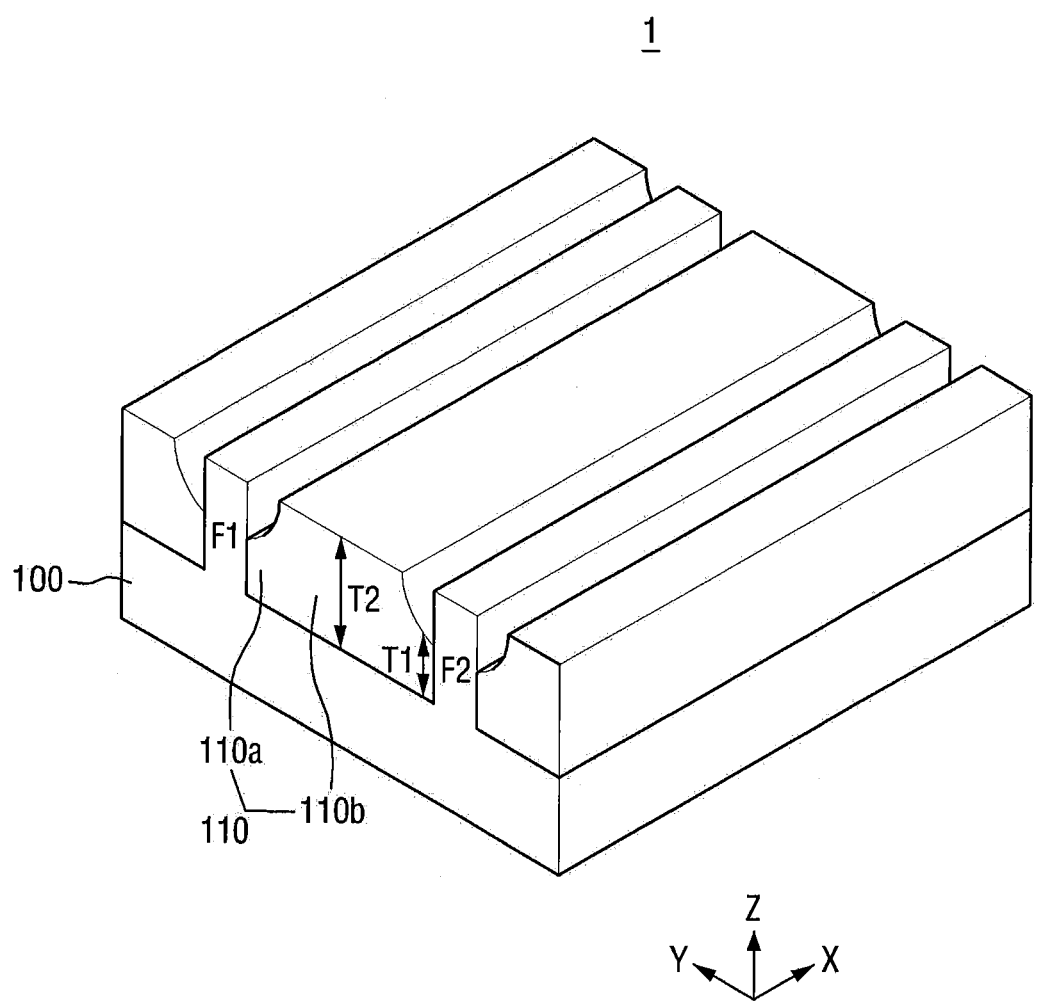
FIG. 5 is a partial perspective view illustrating a field insulating film of the semiconductor device illustrated in FIGS. 1 and 2.
Figure 6:
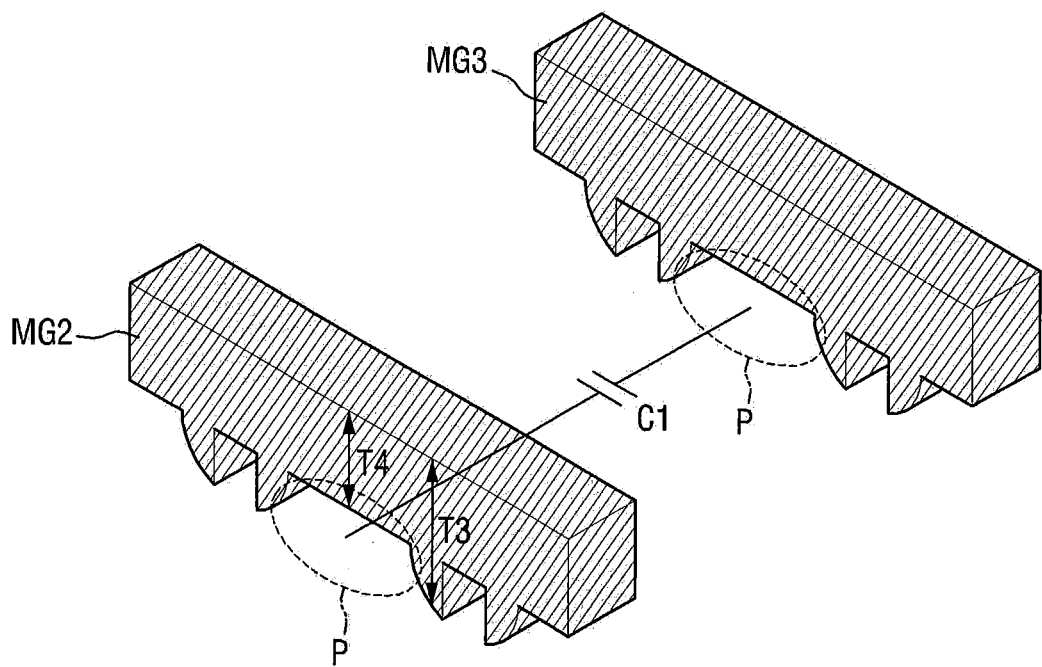
FIG. 6 is a partial perspective view illustrating metal gates of the semiconductor device illustrated in FIGS. 1 and 2.

FIG. 1 is a layout diagram illustrating a semiconductor device according to a first embodiment of the present invention. FIG. 2 is a perspective cut-away view of a region A in FIG. 1, FIG. 3 is a cross-sectional view taken along line B-B in FIG. 1, and FIG. 4 is a cross-sectional view taken along line D-D in FIG. 1. FIG. 5 is a partial perspective view illustrating a field insulating film of the semiconductor device illustrated in FIGS. 1 and 2, and FIG. 6 is a partial perspective view illustrating a metal gate of the semiconductor device illustrated in FIGS. 1 and 2.

Referring to FIGS. 1 to 6, a semiconductor device 1 includes a plurality of active fins F1 and F2, a field insulating film 110, and a plurality of gate structures GS1 to GS4.

The plurality of active fins F1 and F2 may include a first active fin F1 and a second active fin F2. Only two active fins F1 and F2 are illustrated in the drawings. However, the present invention is not limited thereto. The number of active fins F1 and F2 may be much larger if needed.

The first and second active fins F1 and F2 may project from the substrate 100 in a first direction (e.g., the Z direction). Particularly, in this embodiment, the first and second active fins F1 and F2 may be formed in a body with the substrate 100 as illustrated. Specifically, substrate 100 may comprise a semiconductor material, and the first and second active fins F1 and F2 may be formed by etching the substrate 100. However, the present invention is not limited thereto, and the method for forming the first and second active fins F1 and F2 may be changed without limit.

In the drawings, the cross-sectional shapes of the first and second active fins F1 and F2 are each rectangular for cross-sections taken along the X direction, but the present invention is not limited to such a shape. In some embodiments of the present invention, the cross-sectional shapes of the first and second active fins F1 and F2 may be changed to a tapered shape in which the width (e.g., the length in the X direction) of the first and second active fins F1 and F2 becomes wider as they go from an upper portion to a lower portion. Further, in other embodiments of the present invention, the cross-sectional shape of the first and second active fins F1 and F2 may be a chamfered shape. That is, one or more of the corner portions of the first and second active fins F1 and F2 may be rounded.

The first and second active fins F1 and F2 may be disposed to extend in a second direction (e.g., the Y direction). Since the first and second active fins F1 and F2 are formed long along the second direction (e.g., the Y direction), they may include a long side that extends along the second direction (e.g., the Y direction) and a short side that is formed along a third direction (e.g., the X direction). Even if the corner portions of the first and second active fins F1 and F2 are rounded, those skilled in the art to which the present invention pertains can still discriminate between the long side and the short side.

In this embodiment, the first and second active fins F1 and F2 may include a semiconductor material. Accordingly, the first and second active fins F1 and F2 may be used as channels in a transistor. That is, channels may be formed to be connected to each other along three surfaces of the first and second active fins F1 and F2. However, the present invention is not limited thereto, and in some embodiments, the channels of the transistor may be formed on two surfaces of the first and second active fins F1 and F2 that face each other.

The field insulating film 110 may be disposed on the substrate 100. Specifically, as shown in FIGS. 2 and 5, the field insulating film 110 may be disposed between the first and second active fins F1 and F2. The field insulating film 110 may surround portions of the first and second active fins F1 and F2. Specifically, as illustrated, the field insulating film 110 may surround lower parts of the first and second active fins F1 and F2.

In this embodiment, the field insulating film 110 may include a first region 110a and a second region 110b. Here, as illustrated, the first region 110a of the field insulating film 110 may be defined as the portion(s) of the field insulating film 110 that are disposed adjacent to the first and second active fins F1 and F2, and the second region 110b of the field insulating film 110 may be defined as the portion of the field insulating film 110 that is spaced apart from the first and second active fins F1 and F2 as compared to the first region 110a.

In this embodiment, the thickness T1 of the first region 110a in the Z direction may be smaller than the thickness T2 of the second region 110b in the Z direction. That is, the thickness T2 of the field insulating film 110 that is disposed in the intermediate region between the first active fin F1 and the second active fin F2 may be thicker than the thickness T1 of the field insulating film 110 that is disposed in the regions that are adjacent to the first and second active fins F1 and F2.

In this embodiment, at least part of an upper surface of the second region 110b may be substantially flat. The upper surface of the second region 110b may be substantially flat because etching may not be performed with respect to the whole surface of the field insulating film 11Q that is disposed between the first active fin F1 and the second active fin F2, but instead the etching may be locally performed only with respect to the first region 110a of the field insulating film 110. A more detailed explanation of the etching of the field insulating film 110 is provided herein.

The field insulating film 110 may be an oxide film, a nitride film, an oxynitride film, or a combination film thereof, but the present invention is not limited thereto.

The plurality of gate structures GS1 to GS4 may be disposed on the field insulating film 100 to surround at least parts of the active fins F1 and F2. As illustrated, the plurality of gate structures GS1 to GS4 may be disposed to extend in the second direction (e.g., the Y direction). An isolation film 190 may be formed between the gate structures GS1 to GS4.

In some embodiments of the present invention, the gate structures GS1 to GS4 may be grouped into pairs. Further, a plurality of active bases, which are separated from each other by deep trench isolation (DTI) films, may be formed for the plurality of gate structures GS1 to GS4 that are grouped into pairs. However, the present invention is not limited to such a shape, but the shape of the plurality of gate structures GS1 to GS4 may be changed without limit.

Each of the respective gate structures (e.g., GS1) may include an interface film 120, a gate insulating film 130, and a metal gate (e.g., MG1), which are sequentially laminated.

The interface film 120 serves to provide an improved interface between the active fins F1 and F2 and the gate insulating film 130. The interface film 120 may include a low-k material having a permittivity of 9 or less, for example, a silicon oxide film (k is about 4) or a silicon oxynitride film (k is about 4 to 8 depending on the content of oxygen atoms and nitrogen atoms). Further, the interface film 120 may be made of silicate, or may be made of a combination of the films as exemplified above.

The gate insulating film 130 that is disposed on the interface film 120 may be made of, for example, a high-k material. In some embodiments of the present invention, the gate insulating film 130 may be made of, for example, a material, such as HfO2, Al2O3, ZrO2, or TaO2, but the present invention is not limited thereto.

The gate insulating film 130 may extend in the first direction (e.g., the Z direction) along side walls of a spacer 165 that is disposed on both sides of each of the gate structures (e.g., GS1). In this embodiment, the gate insulating film 130 is formed through a replacement process (or a gate last process). However, the present invention is not limited thereto, and hence the shape of the gate insulating film 13Q may differ in other embodiments.

The spacer 165 may include at least one of a nitride film and an oxynitride film. The spacer 165 may be formed on the side walls of each gate structure (e.g., GS1). FIG. 3 illustrates that the spacer 165 has a curved side surface, but the present invention is not limited thereto. The shape of the spacer 165 may be changed from the shape depicted in FIG. 3 without limit. For example, in some embodiments of the present invention, the shape of the spacer 165 may be changed to an "I" shape or an "L" shape.

The metal gate MG1 may include work function metal WM and gate metal GM. The work function metal WM may serve to adjust the work function, and the gate metal GM may serve to fill a space formed by the work function metal WM. The work function metal WM may have a single-film structure composed of metal or a multi-film structure composed of a metal nitride film and metal. The metal that forms the work function metal WM may be, for example, Al, W, Ti, or a combination thereof, and the metal nitride film may be TiN, TaN, or a combination thereof, but the present invention is not limited thereto. The work function metal WM may be disposed to extend in the first direction (e.g., the Z direction) along the side walls of the spacer 165 that are disposed on both sides of the gate structure (e.g., GS1) in a similar manner to the gate insulating film 130. The gate metal GM may include metal having high conductivity. An example of the metal may be W or Al, but the present invention is not limited thereto.

As illustrated in FIG. 3, a source region 161a and a drain region 161b may be disposed in the active fins F1 and F2 on both sides of each of the gate structures (e.g., GS1). Although FIG. 3 illustrates that upper surfaces of the source region 161a and the drain region 161b have substantially the same height as that of an upper surface of the first active fin F1, the present invention is not limited to the illustrated shape. In some embodiments of the present invention, the upper surfaces of the source region 161a and the drain region 161b may have a height that is different from the height of the upper surface of the first active fin F1.

In this embodiment, a third thickness T3 of the gate structure (e.g., GS2) that is disposed on the first region 110a of the field insulating film 110 may be thicker than a fourth thickness T4 of the gate structure (e.g., GS2) that is disposed on the second region 110b of the field insulating film 110. Accordingly, as illustrated in FIG. 6, the third thickness T3 of the metal gate (e.g., MG2) that is disposed on the first region 110a of the field insulating film 110 may be thicker than the fourth thickness T4 of the metal gate (e.g., MG2) that is disposed on the second region 110b of the field insulating film 110. In other words, the field insulating film 110 is disposed between the first active fin F1 and the second active fin F2 with a thickness that is relatively thick, and thus the metal gate (e.g., MG2) may not be disposed in the region between the first active fin F1 and the second active fin F2.

Through the shape of the metal gate (e.g., MG2) as described above, parasitic capacitance between the metal gates (e.g., MG2 and MG3) that extend in parallel to each other may be decreased. Such decrease of the parasitic capacitance between the metal gates (e.g., MG2 and MG3) may improve the operating speed of the semiconductor element that includes the metal gates (e.g., MG2 and MG3), and further improve the operating characteristic of the semiconductor device 1.

Hereinafter, referring to FIGS. 6 to 8, the above-described effects will be described in more detail.

Figure 7:
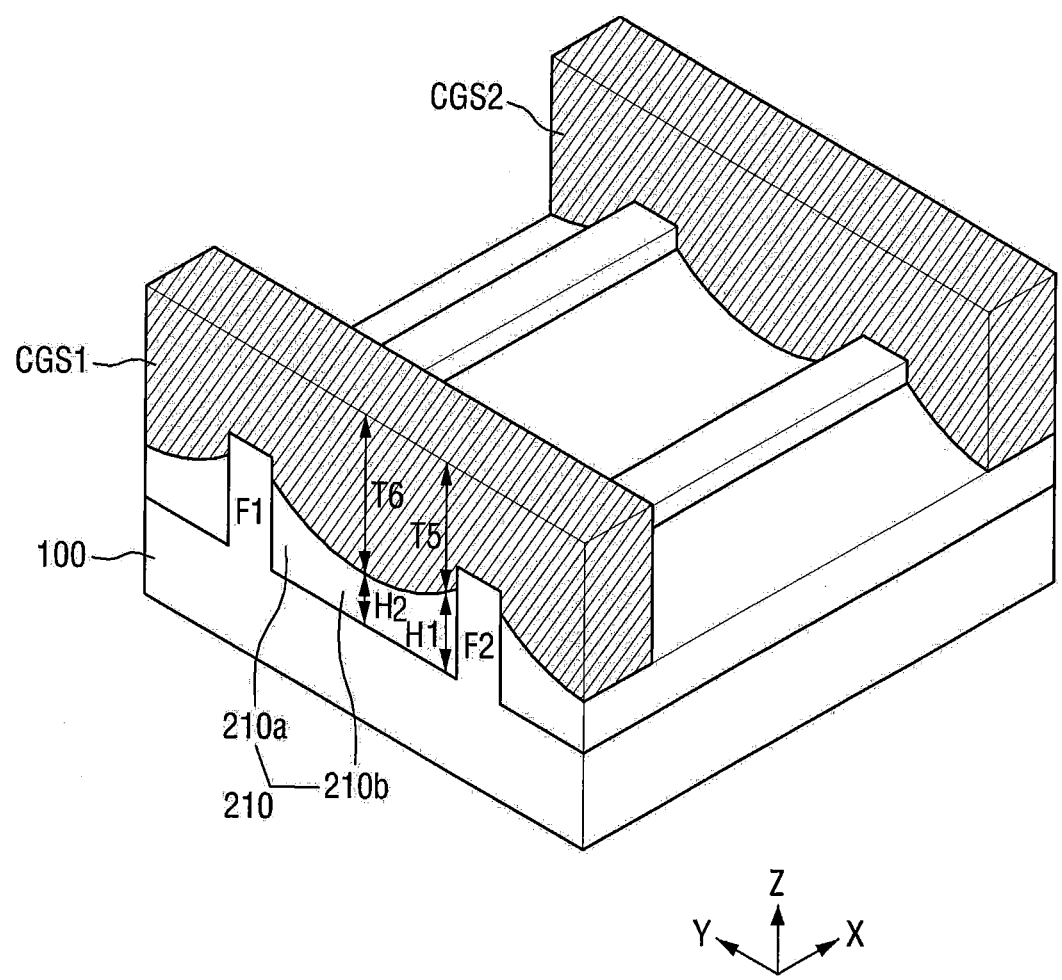
FIGS. 7 and 8 are views explaining the effects of a semiconductor device according to a first embodiment of the present invention.
Figure 8:
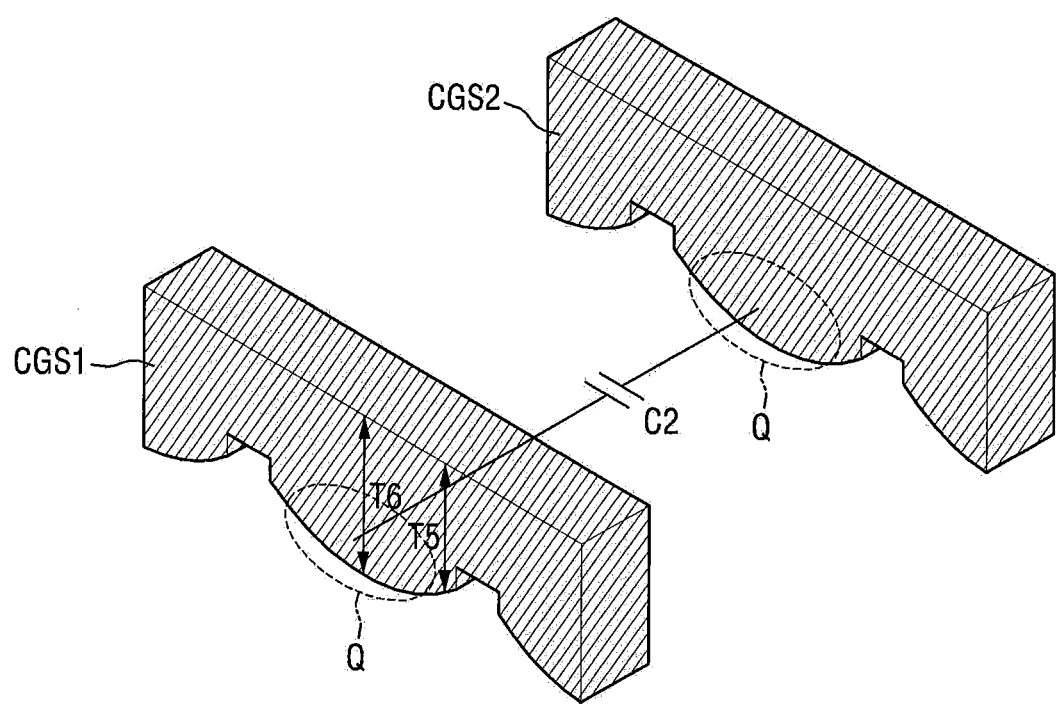

FIGS. 7 and 8 are perspective views explaining the effects of a semiconductor device according to a first embodiment of the present invention.

FIG. 7 illustrates a semiconductor device in which, unlike the semiconductor device 1 as described above, the field insulating film 210 that is formed on the substrate 100 is formed to have a first height H1 in the first region 210a that is adjacent to the first and second active fins F1 and F2, and is formed in the second region 210b that is spaced apart from the first and second active fins F1 and F2 to have a second height H2 that is less than the first height H1.

In accordance with the shape of the field insulating film 210 as described above, the gate structures CGS1 and CGS2 are formed on the first region 210a with a fifth thickness T5, and are formed on the second region 210b with a sixth thickness T6 that is thicker than the fifth thickness T5. In other words, the field insulating film 210 is formed in the region between the first active fin F1 and the second active fin F2 with a thickness that is relatively thin. In this case, as illustrated in FIG. 8, the value of the parasitic capacitance C2 between the gate structures (see region Q) that are disposed in the region between the first active fin F1 and the second active fin F2 may become large. However, in the semiconductor device 1 according to this embodiment, as illustrated in FIG. 6, the metal gates MG2 and MG3 (or gate structures GS2 and GS3) are not disposed in a region P that corresponds to the region Q as described above, and thus the value of the parasitic capacitance C1 between the metal gates MG2 and MG3 (or gate structure GS2 and GS3) may be significantly decreased.

Figure 9:
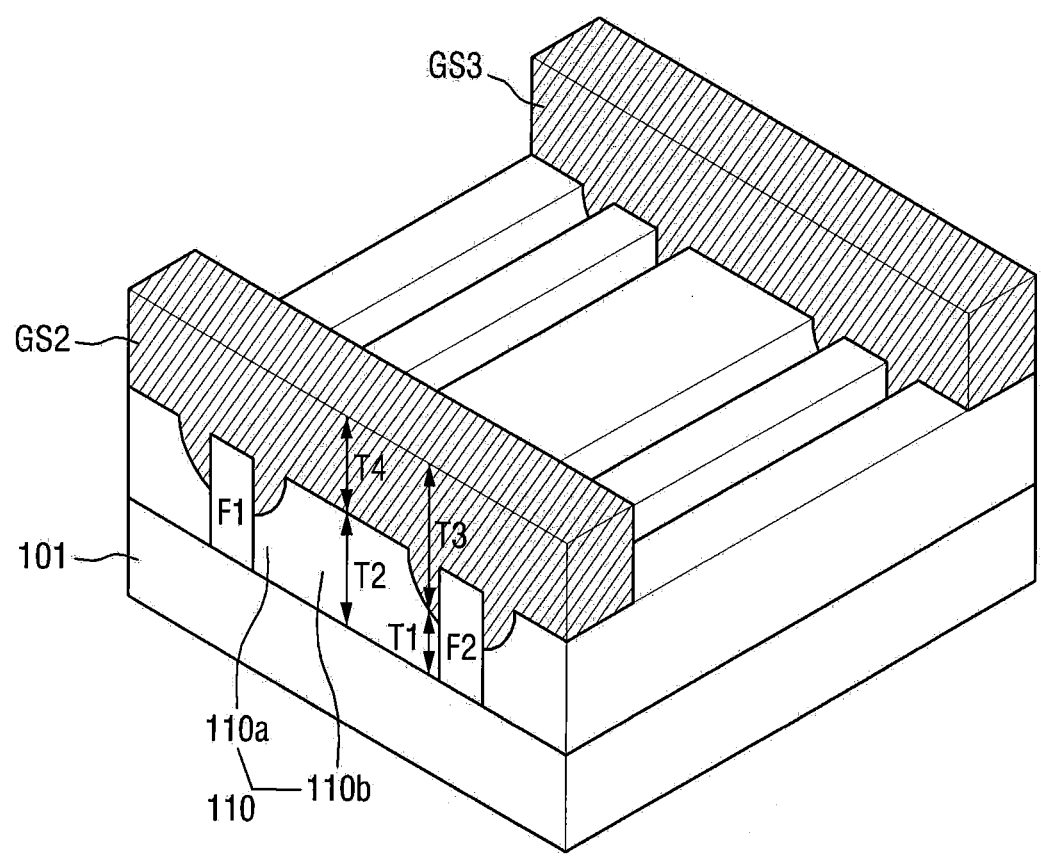
FIG. 9 is a view illustrating a semiconductor device according to a second embodiment of the present invention.

FIG. 9 is a view illustrating a semiconductor device according to a second embodiment of the present invention. The explanation that follows will focus on differences between the second embodiment and the above-described first embodiment.

Referring to FIG. 9, the first and second active fins F1 and F2 of the semiconductor device 2 are not formed in a body with the substrate 101 as in the above-described embodiment, but instead are separately formed. Specifically, in the semiconductor device 2 according to this embodiment, the first and second active fins F1 and F2 may be formed by patterning a semiconductor active layer that is formed on the substrate 101 via an epitaxial growth process. The first and second active fins F1 and F2 formed as described above may improve mobility of carriers, and decrease the amount of leakage current that may be generated during operation of the semiconductor device 2.

Figure 10:
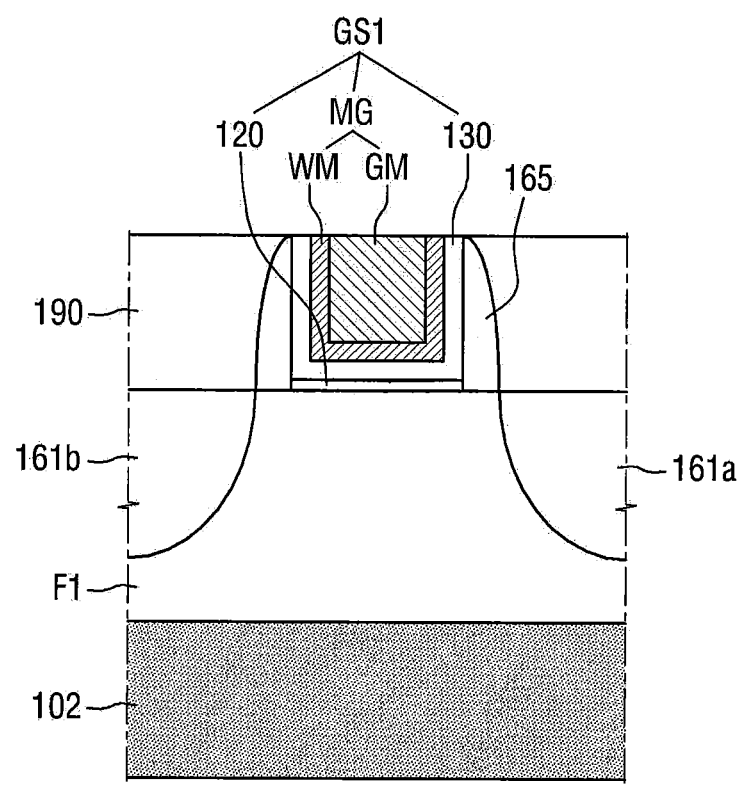
FIG. 10 is a cross-sectional view illustrating a semiconductor device according to a third embodiment of the present invention.

FIG. 10 is a view illustrating a semiconductor device according to a third embodiment of the present invention. The explanation that follows will focus on differences between the third embodiment and the above-described first and second embodiments.

Referring to FIG. 10, a SOI (Silicon On Insulator) substrate may be used in the semiconductor device 3. Specifically, an active fin F1 may be formed by forming monocrystalline silicon on a buried oxide film 102 and patterning the monocrystalline silicon. At this time, although not illustrated in detail, the buried oxide film 102 and the field insulating film 101 may come in contact with each other. Using the SOI substrate, a delay time can be reduced during operation of the semiconductor device 3.

Figure 11:
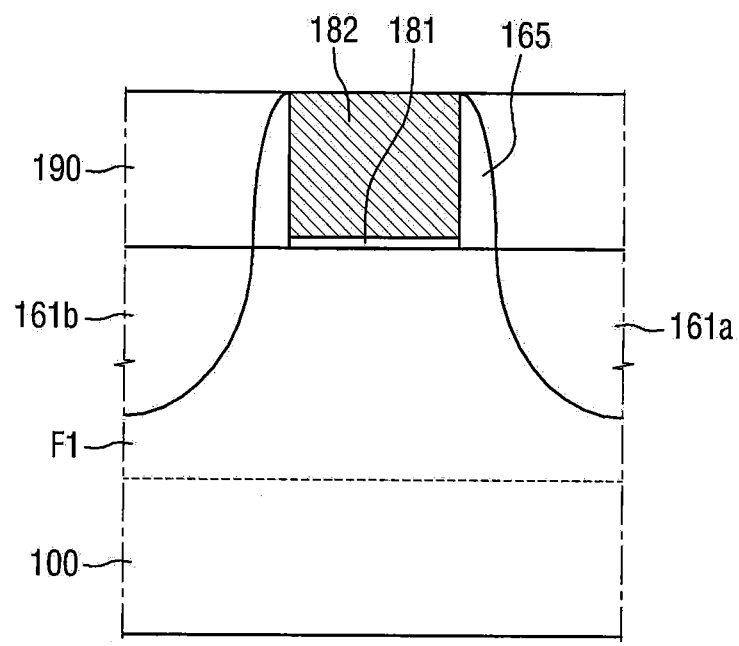
FIG. 11 is a cross-sectional view illustrating a semiconductor device according to a fourth embodiment of the present invention.

FIG. 11 is a view illustrating a semiconductor device according to a fourth embodiment of the present invention. The explanation that follows will focus on differences between the fourth embodiment and the above-described first through third embodiments.

Referring to FIG. 11, gate structures 181 and 182 of the semiconductor device 4 may be formed using a gate first process rather than the gate last process according to the above-described embodiments. Unlike the above-described embodiments, the gate insulating film 181 may not be formed to extend in the first direction (e.g., the Z direction in FIG. 2) along the side walls of the spacer 165. Further, in the same manner as the above-described embodiments, the gate electrode 182 may include gate metal (GM in FIG. 3), or may be made of polysilicon or the like.

Figure 12:
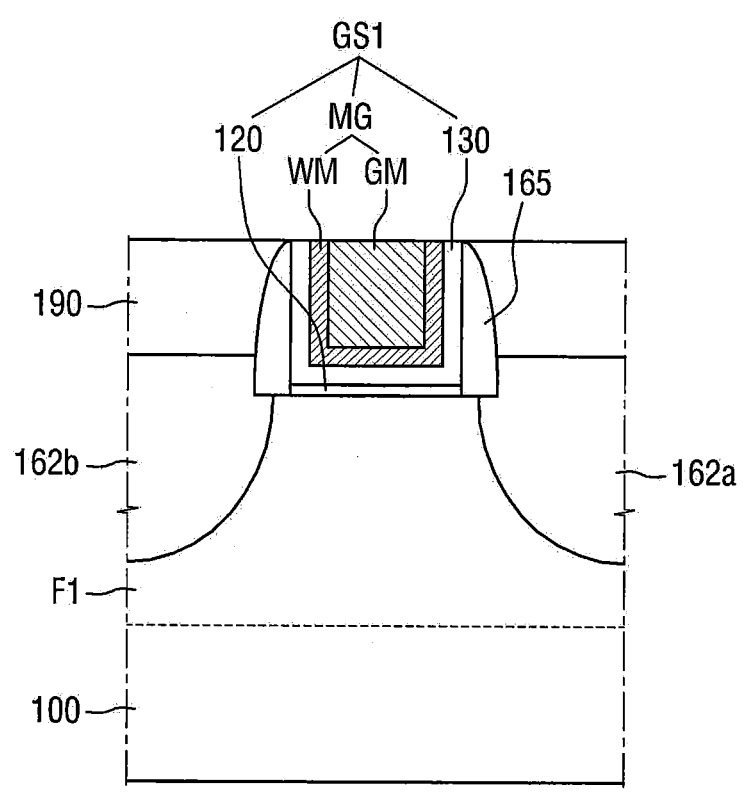
FIG. 12 is a cross-sectional view illustrating a semiconductor device according to a fifth embodiment of the present invention.

FIG. 12 is a view illustrating a semiconductor device according to a fifth embodiment of the present invention. The explanation that follows will focus on differences between the fifth embodiment and the above-described first through fourth embodiments.

Referring to FIG. 12, in the semiconductor device 5, the source region 162a and the drain region 162b may have an elevated shape. In particular, the upper surfaces of the source region 162a and the drain region 162b may be formed to be higher than the lower surface of the gate structure GS1.

Further, as illustrated, parts of the source region 162a and the drain region 162b may be formed to overlap the spacer 165. That is, the parts of the source region 162a and the drain region 162b may be in a tuck shape that is pushed into the lower portion of the spacer 165.

Figure 13:
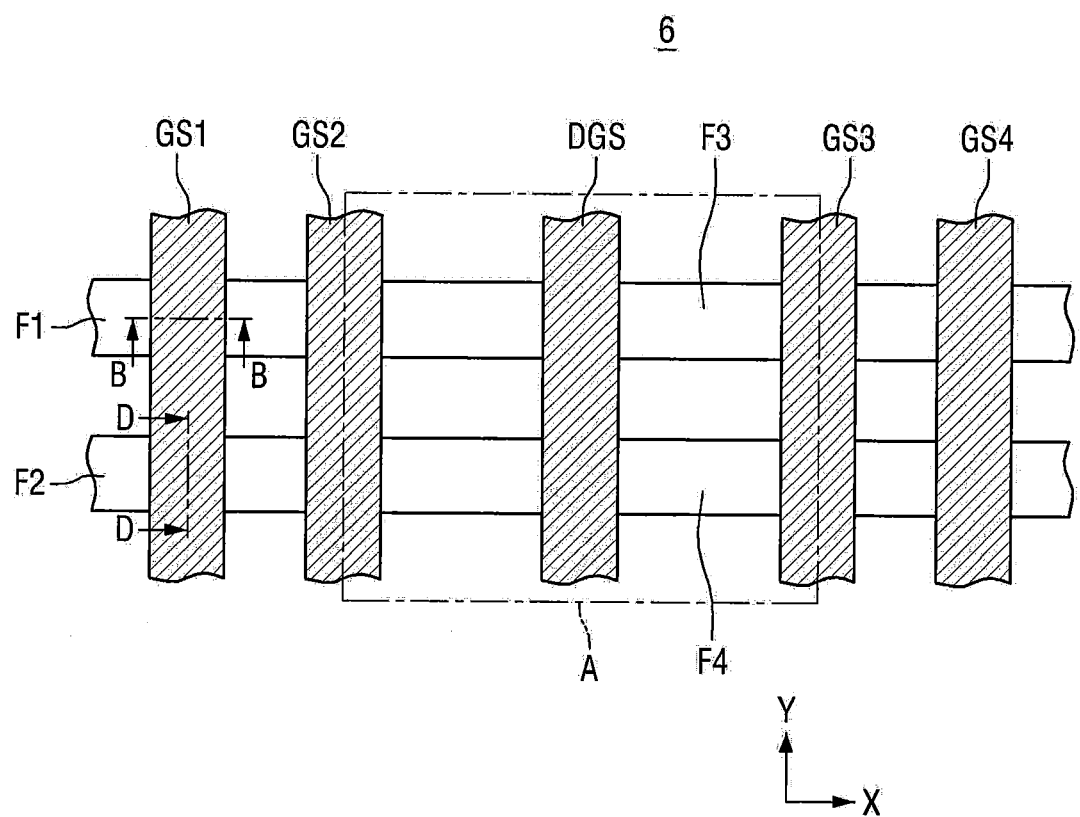
FIG. 13 is a layout diagram illustrating a semiconductor device according to a sixth embodiment of the present invention.
Figure 14:
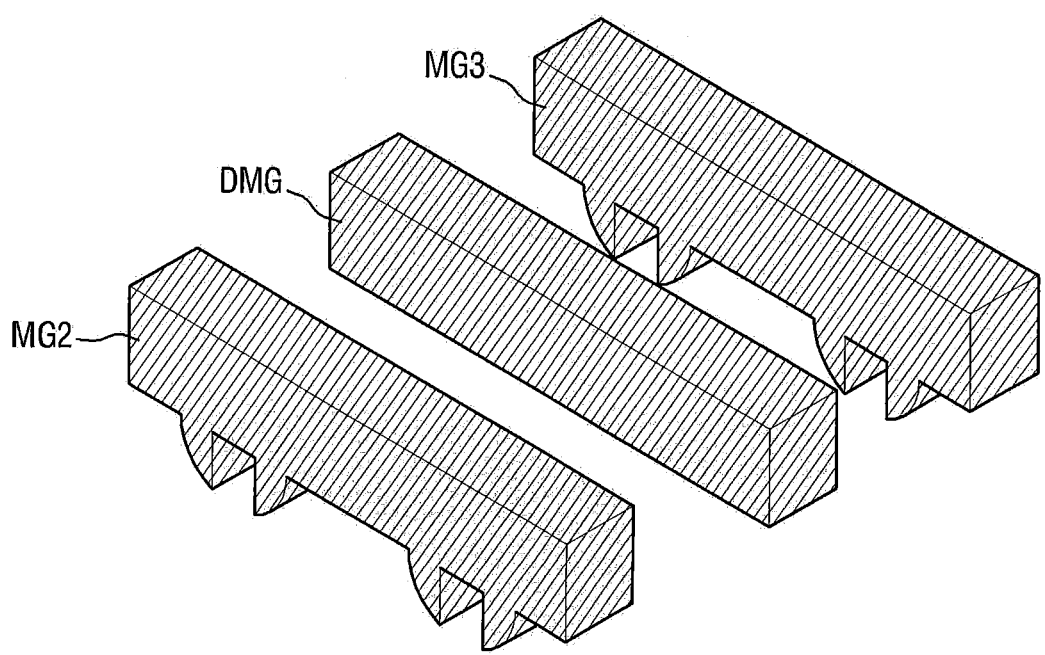
FIG. 14 is a partial perspective view illustrating a metal gate of the semiconductor device illustrated in FIG. 13.

FIG. 13 is a plan view illustrating a semiconductor device according to a sixth embodiment of the present invention. FIG. 14 is a partial perspective view illustrating a metal gate of the semiconductor device of FIG. 13. The explanation that follows will focus on differences between the sixth embodiment and the above-described first through fifth embodiments.

First, referring to FIG. 13, the semiconductor device 6 may include first to fourth active fins F1 to F4. The first to fourth active fins F1 to F4 may extend in the third direction (e.g., the X direction). Since the first to fourth active fins F1 to F4 are formed along the third direction (e.g., the X direction), they include a long side that extends along the third direction (e.g., the X direction), and a short side that extends along the second direction (e.g., the Y direction).

The first active fin F1 and the third active fin F3 are separated from each other in the third direction (e.g., the X direction), and the second active fin F2 and the fourth active fin F4 are separated from each other in the third direction (e.g., the X direction).

A dummy gate structure DOS may be disposed on the end portions of the first to fourth active fins F1 to F4. That is, the dummy gate structure DGS may be disposed adjacent to the short sides of the first to fourth active fins F1 to F4, and may be formed to extend in the second direction (e.g., the Y direction).

In this embodiment, the normal gate structures GS1 to GS4 may extend in the second direction (e.g., the Y direction) and may surround at least parts of the plurality of active fins F1 to F4 as in the above-described embodiments. That is, in this embodiment, the dummy gate structure DOS may be disposed on the field insulating film 110 between the first to fourth active fins F1 to F4.

As illustrated in FIG. 14, the shape of a dummy metal gate DMG that is included in the dummy gate structure DOS may be different from the shape of normal metal gates MG2 to MG3 that are included in the normal gate structures GS1 to GS4. In particular, the lower portion of the dummy metal gate DMG is not disposed on the active fins F1 to F4. In some embodiments of the present invention, the dummy metal gate DMG may be used as a redistribution line, but the present invention is not limited thereto.

Figure 15:
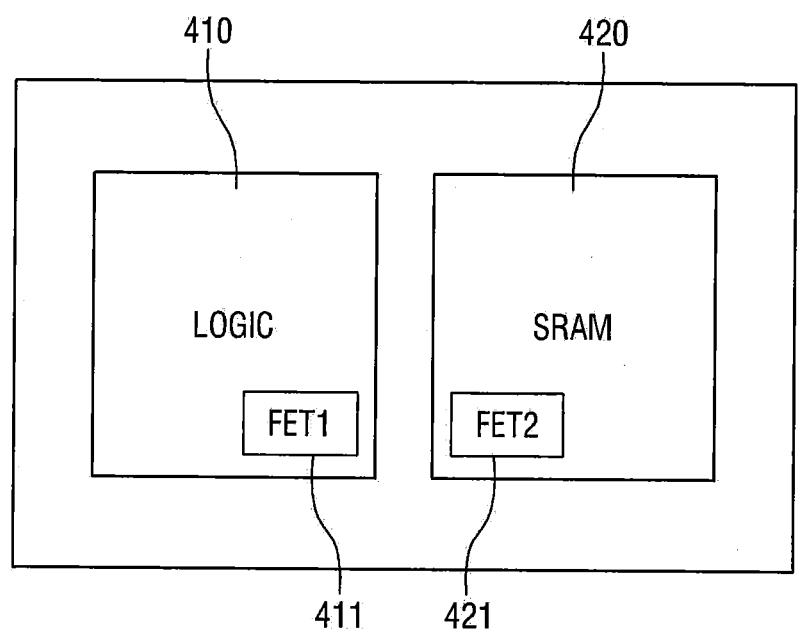
FIG. 15 is a schematic diagram illustrating a semiconductor device according to a seventh embodiment of the present invention.
Figure 16:
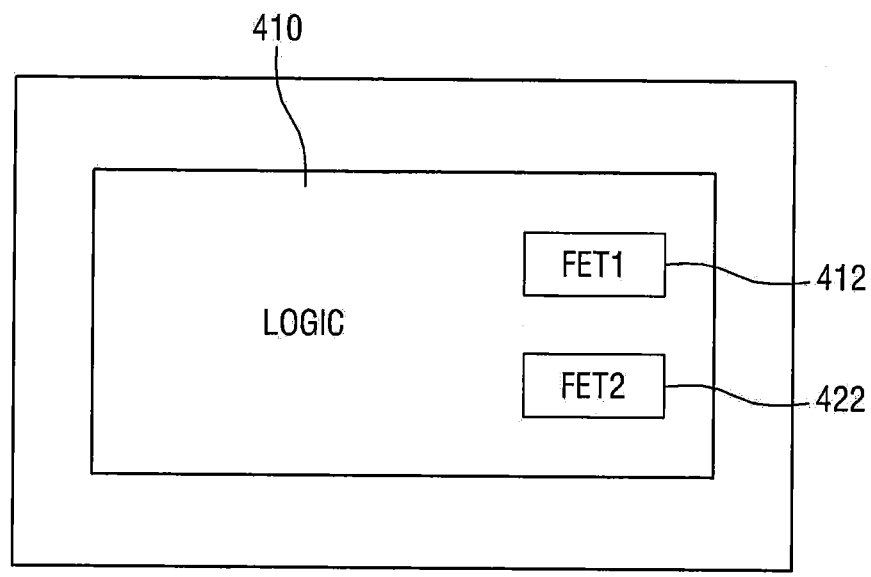
FIG. 16 is a schematic diagram illustrating a semiconductor device according to an eighth embodiment of the present invention.

FIG. 15 is a view illustrating a semiconductor device according to a seventh embodiment of the present invention, and FIG. 16 is a view illustrating a semiconductor device according to an eighth embodiment of the present invention.

Referring to FIG. 15, the semiconductor device 7 according to the seventh embodiment of the present invention may include a logic region 410 and an SRAM region 420. A first transistor 411 is disposed in the logic region 410, and a second transistor 421 may be disposed in the SRAM region 420.

Next, referring to FIG. 16, the semiconductor device 8 according to the eighth embodiment of the present invention includes the logic region 410. Third and fourth transistors 412 and 422, which are different from each other, are disposed in the logic region 410. Although not separately illustrated, the semiconductor device 8 may also include an SRAM region in which the third and fourth transistors 412 and 422, which are different from each other, may be disposed.

Here, the first transistor 411 may be any one of the semiconductor devices 1 to 6 according to the embodiments of the present invention as described above, and the second transistor 421 may be another of the semiconductor devices 1 to 6 according to the embodiments of the present invention as described above. For example, the first transistor 411 may be the semiconductor device 1 of FIG. 3, and the second transistor 421 may be the semiconductor device 5 of FIG. 12.

The third transistor 412 may be any one of the semiconductor devices 1 to 6 according to the embodiments of the present invention as described above, and the fourth transistor 422 may be another of the semiconductor devices 1 to 6 according to the embodiments of the present invention as described above.

FIG. 15 exemplarily illustrates the logic region 410 and the SRAM region 42Q, but is not limited thereto. For example, the present invention can also be applied to a region in which a memory that is different from that of the logic region 410 is formed (e.g., DRAM, MRAM, RRAM, or PRAM).

Next, referring to FIGS. 4 and 17 to 22, a method for fabricating a semiconductor device according to embodiments of the present invention will be described.

FIGS. 17 to 22 are views of intermediate steps explaining a method for fabricating a semiconductor device according to embodiments of the present invent.

Figure 17:
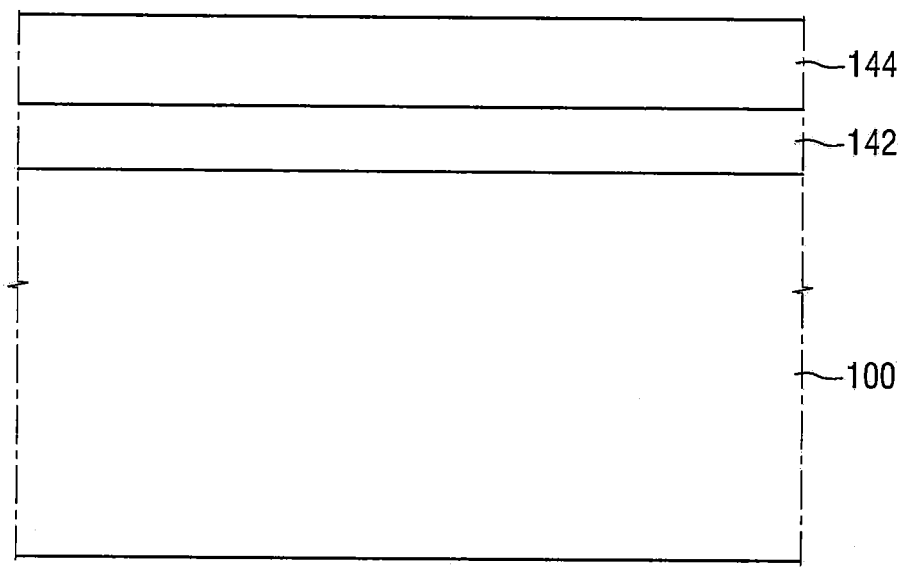
FIGS. 17 to 22 are views of intermediate steps explaining a method for fabricating a semiconductor device according to embodiments of the present invention.

First, referring to FIG. 17, a pad insulating film 142 and a hard mask film 144 are sequentially laminated on a substrate 100. In this embodiment, the substrate 100 may be, for example, a semiconductor substrate, and the pad insulating film 142 may include, for example, an oxide film. The hard mask film 144 may include, for example, a silicon nitride film SiN, but the present invention is not limited thereto.

Figure 18:
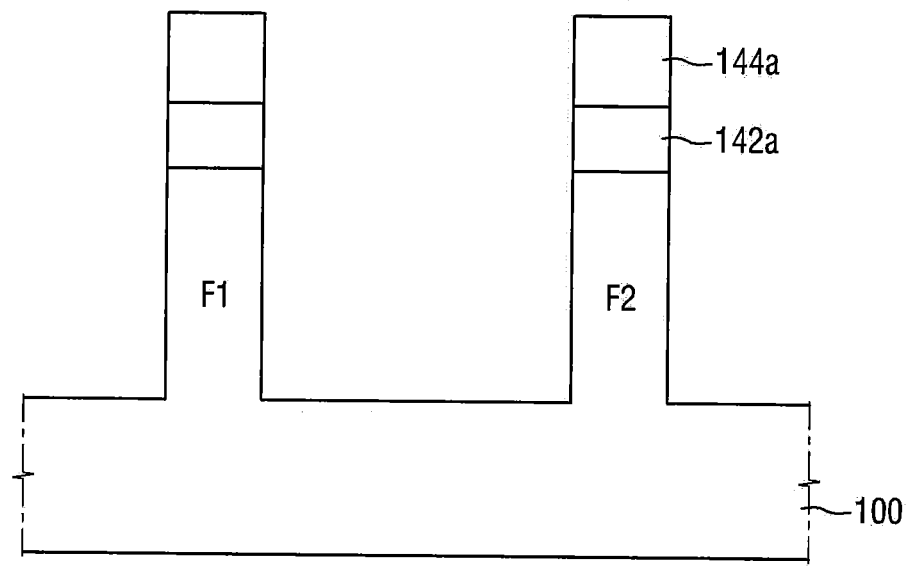

Next, referring to FIG. 18, a hard mask film pattern 144a is formed through patterning of the hard mask film 144 in FIG. 17. Then, a pad insulating film pattern 142a and first and second active fins F1 and F2 are formed through sequential etching of parts of the pad insulating film 142 in FIG. 17 and the substrate 100 using the hard mask film pattern 144a as a mask.

In the drawing, it is illustrated that the cross-section of the first and second active fins F1 and F2 is a rectangle, but the present invention is not limited to such a shape. In some embodiments of the present invention, the cross-section of the first and second active fins F1 and F2 may be changed to a tapered shape in which the width of the first and second active fins F1 and F2 becomes wider as they go from an upper portion to a lower portion. Further, in other embodiments of the present invention, the cross-section of the first and second active fins F1 and F2 may have a chamfered shape. That is, the corner portion of the first and second active fins F1 and F2 may be rounded. Other cross-sectional shapes may also be used in further embodiments.

Figure 19:
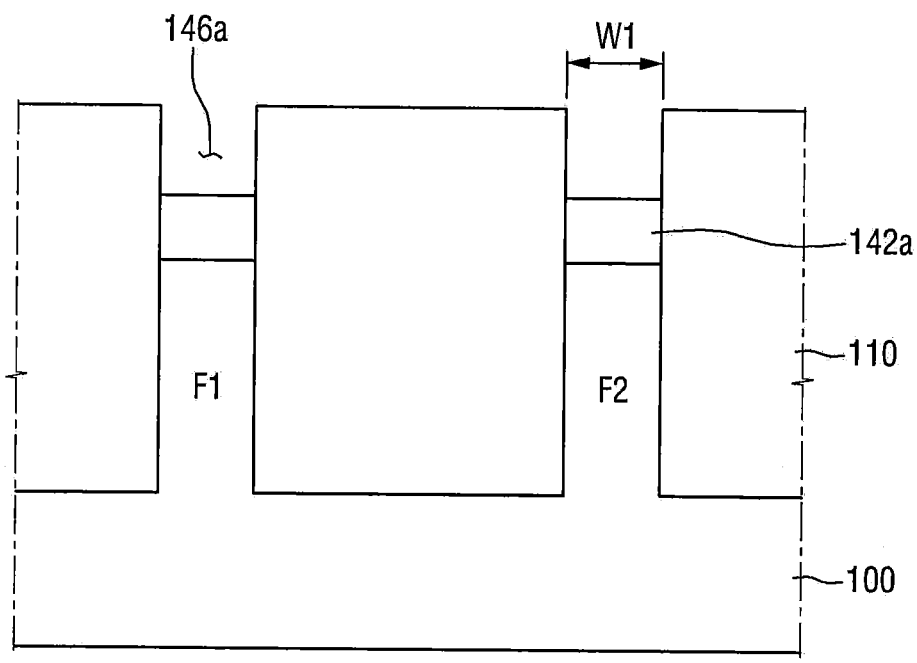

Referring to FIG. 19, a field insulating film 110 may be formed on the substrate 100 and on the first and second active fins F1 and F2, the pad insulating film 142a and the hard mask film pattern 144a. The field insulating film 110 may then be planarized so that an upper surface of the hard mask film pattern 144a in FIG. 18 is exposed. Then, by removing the hard mask film pattern 144a, of which the upper surface is exposed, a first trench 146a is formed in the field insulating film 110. The width W1 of the first trench 146a may be substantially the same as the width of the first and second active fins F1 and F2.

Figure 20:
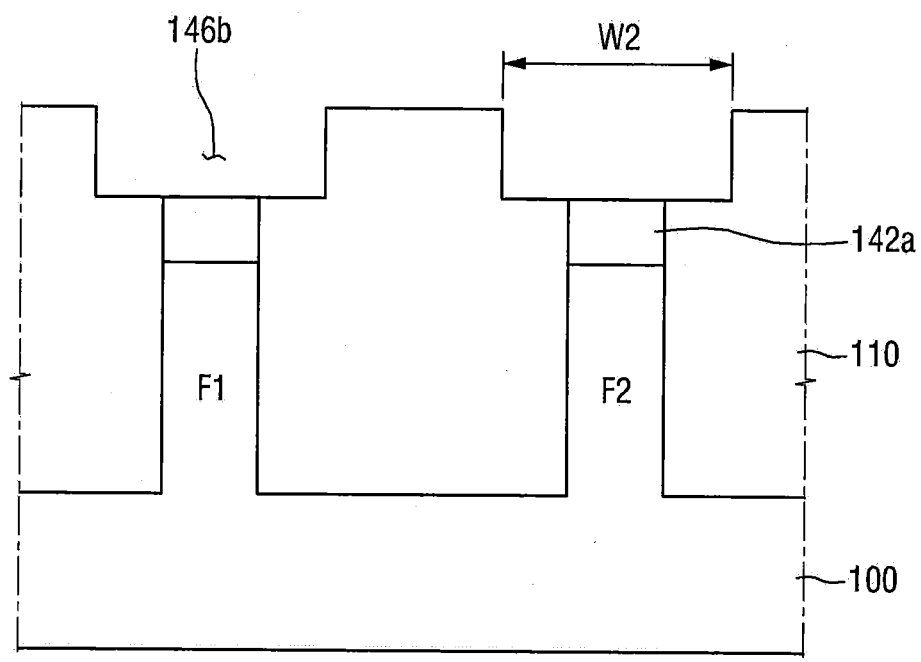

Next, referring to FIG. 20, a second trench 146b is formed by etching the field insulating film 110 that is disposed on a side wall and a lower portion of the first trench 146a in FIG. 19. Here, the field insulating film may be etched by, for example, isotropic etching such as wet etching. In some embodiments, the etching may be, for example, isotropic wet etching using phosphoric acid, but the present invention is not limited thereto.

After this etching step is completed, the width W2 of the second trench 146b may be wider than the width W1 of the first trench 146a that is illustrated in FIG. 19. Further, as illustrated, the width W2 of the second trench 146b may be larger than the width of the first and second active fins F1 and F2. In the first etching process as described above, a part of the upper portion of the pad insulating film pattern 142a may be removed.

Figure 21:
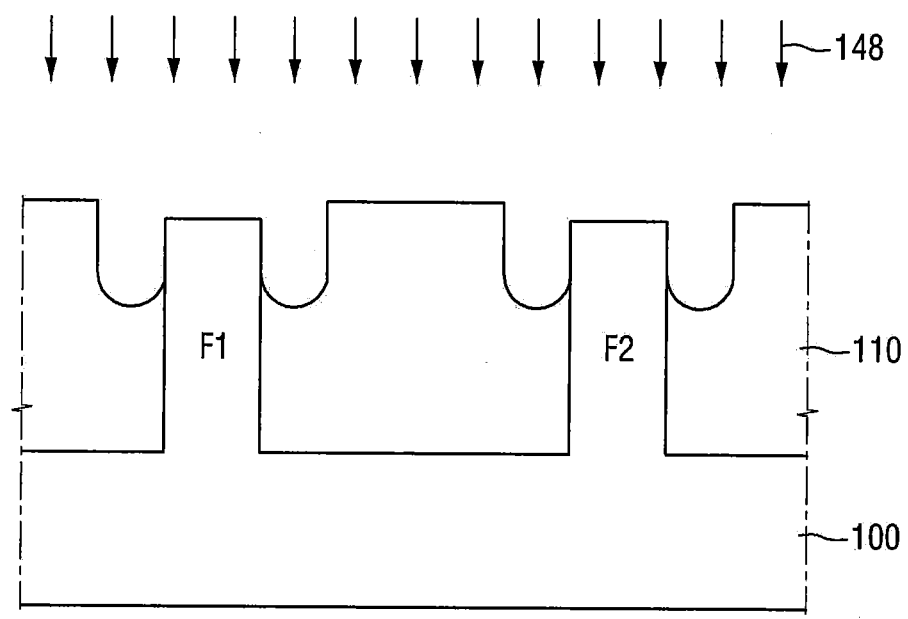

Next, referring to FIG. 21, a second etching step is performed on the field insulating film 110 that is disposed on a side wall and a lower portion of the second trench 146b in FIG. 20. The second etching step may include, for example, anisotropic etching such as dry etching. Specifically, the second etching may be, for example, reactive ion etching (RIE), but the present invention is not limited thereto.

The second etching step may very quickly increase the depth of the second trench 146b in FIG. 20, while the first etching step may increase the width of the second trench 146b in FIG. 20 at a lower speed. Accordingly, as illustrated, the thickness of the field insulating film 110 that is disposed adjacent to the first and second active fins F1 and F2 becomes relatively thin, while the thickness o the field insulating film 110 that is spaced apart from the first and second active fins F1 and F2 remains relatively thick.

Figure 22:
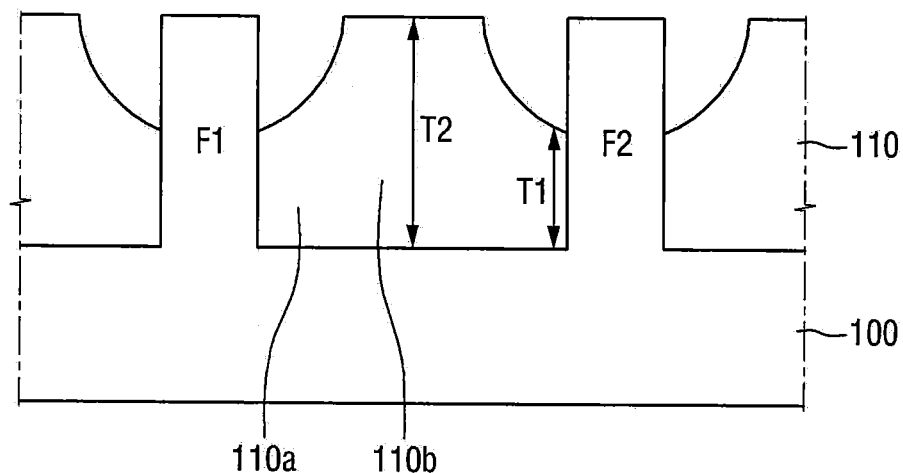

Next, referring to FIG. 22, a third etching step is performed to remove the field insulating film 110 that is formed on the side walls of the first and second active fins F1 and F2. The third etching step may include, for example, isotropic etching. Specifically, the third etching step may be, for example, the isotropic etching, such as SiCoNi, but the present invention is not limited thereto. In some embodiments of the present invention, the third etching step may be omitted if needed.

Through the etching process, the first region 110a, which is disposed adjacent to the first and second active fins F1 and F2, may be formed to have a first thickness T1, and the second region 110b, which is spaced apart from the first and second active fins F1 and F2, is formed to have a second thickness T2 that is thicker than the first thickness T1.

Next, referring to FIG. 4, the gate structure (e.g., GS1) is formed on the active fin (e.g., F2) and the field insulating film 110. Specifically, the interface film 120, the gate insulating film 130, and the metal gate (e.g., MG1) are sequentially formed on the active fin (e.g., F2) and the field insulating film 110.

First, the interface film 120 is formed. The interface film 120 may provide an improved interface between the active fins F1 and F2 and the gate insulting film 130. The interface film 120 may include a low-k material layer having permittivity of 9 or less, for example, a silicon oxide film (k is about 4) or a silicon oxynitride film (k is about 4 to 8 depending on the content of oxygen atoms and nitrogen atoms). Further, the interface film 120 may be made of silicate, or may be made of a combination of the films as exemplified above. The interface film 120 may be formed, for example, through a thermal oxidation process or a deposition process (CVD or PVD), but the present invention is not limited thereto.

Next, the gate insulating film 130 is formed on the interface film 120. The gate insulating film 130 may be made of, for example, a high-k material. In some embodiments of the present invention, the gate insulating film 130 may be made of, for example, a material, such as HfO2, Al2O3, ZrO2, or TaO2, but the present invention is not limited thereto.

Next, the metal gate (e.g., MG1) that includes the work function metal WM and gate metal GM is formed on the gate insulating film 130. The work function metal WM may serve to adjust the work function, and the gate metal GM may serve to fill a space formed by the work function metal WM. The work function metal WM may have a single-film structure composed of metal, or a multi-film structure composed of a metal nitride film and metal. The metal that forms the work function metal WM may be, for example, Al, W, Ti, or a combination thereof, and the metal nitride film may be TiN, TaN, or a combination thereof, but the present invention is not limited thereto. The gate metal GM may include metal having high conductivity. An example of the metal may be W or Al, but the present invention is not limited thereto.

The method for fabricating a semiconductor device 1 as illustrated in FIGS. 1 to 6 has been described above. However, a person of ordinary skill in the art to which the present invention pertains will be able to analogize the method for fabricating the semiconductor devices 2 to 6 as illustrated in FIGS. 9 to 14 from the above description.

For example, in the case of the semiconductor device 2 as illustrated in FIG. 9, the first and second active fins F1 and F2 as illustrated in FIG. 9 may be formed by forming the semiconductor active layer on the substrate 101 through an epitaxial growth process, sequentially laminating the pad insulating film 142 in FIG. 17 and the hard mask film 144 in FIG. 17 on the formed semiconductor active layer, forming the hard mask film pattern 144a in FIG. 18 through patterning of the hard mask film 144 in FIG. 17, and etching the semiconductor active layer using the hard mask film pattern 144a in FIG. 18 as a mask.

In addition, since the method for fabricating the semiconductor devices 3 to 6 as illustrated in FIGS. 10 to 14 can also be easily analogized in a similar manner, the detailed explanation thereof will be omitted.

Figure 23:
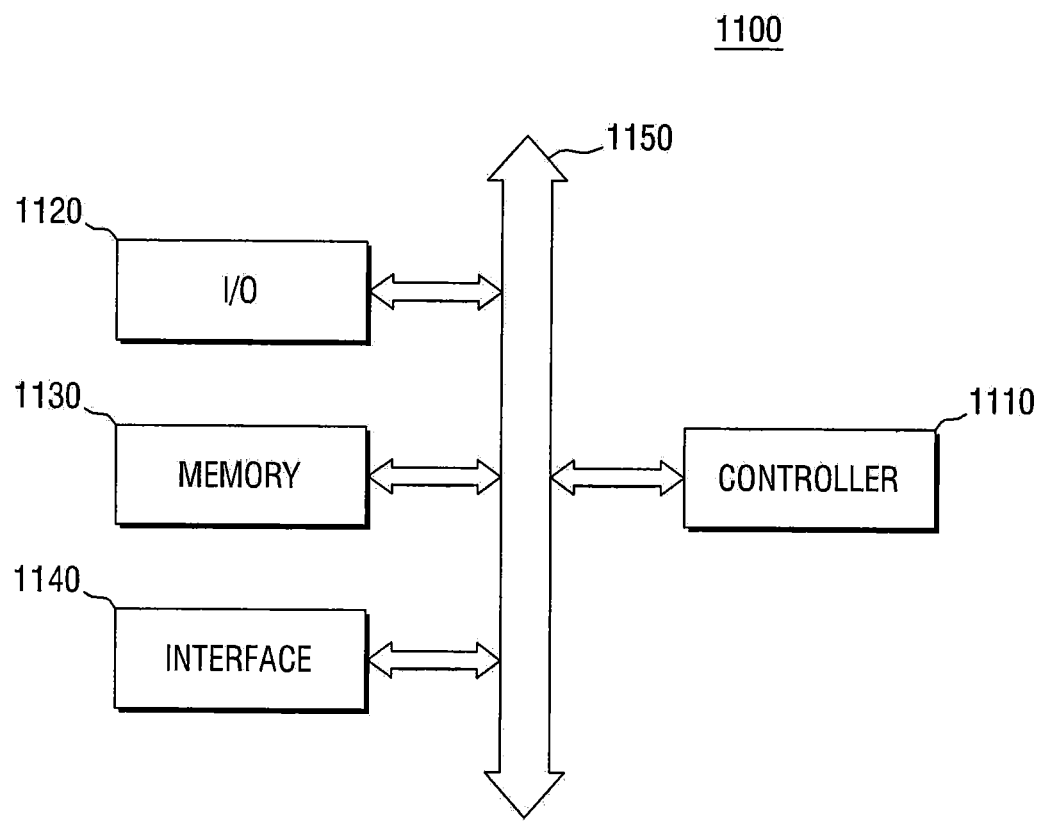
FIG. 23 is a block diagram of an electronic system including a semiconductor device according to some embodiments of the present invention.

FIG. 23 is a block diagram of an electronic system including a semiconductor device according to some embodiments of the present invention.

Referring to FIG. 23, an electronic system 1100 according to an embodiment of the present invention may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110. A fin field-effect transistor according to embodiments of the present invention may be provided inside the memory 1130 or may be provided as a part of the controller 1110 and the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 24:
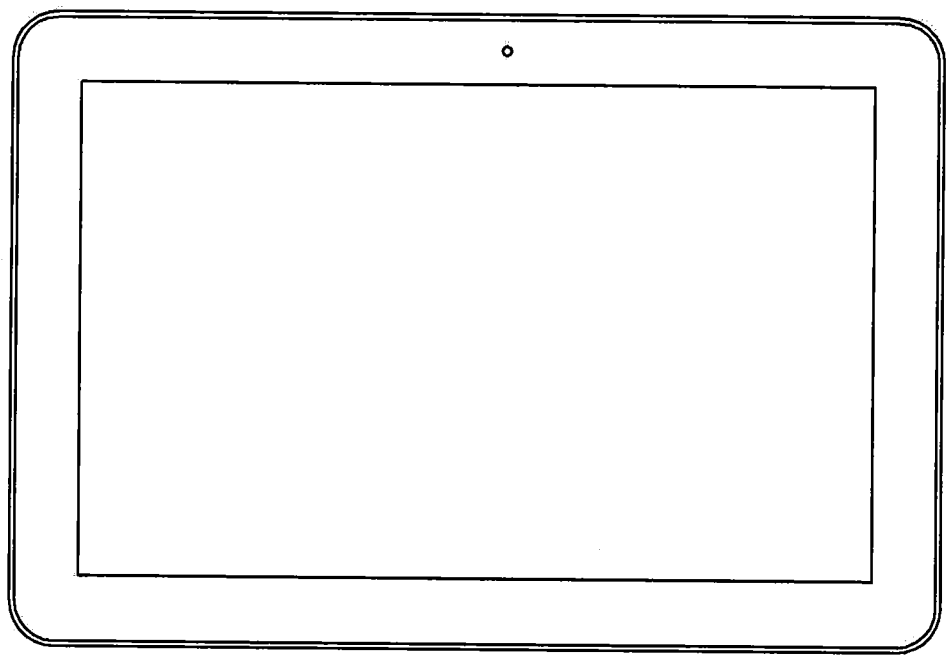
FIGS. 24 and 25 are views of exemplary semiconductor systems to which the semiconductor devices according to some embodiments of the present invention can be applied.
Figure 25:
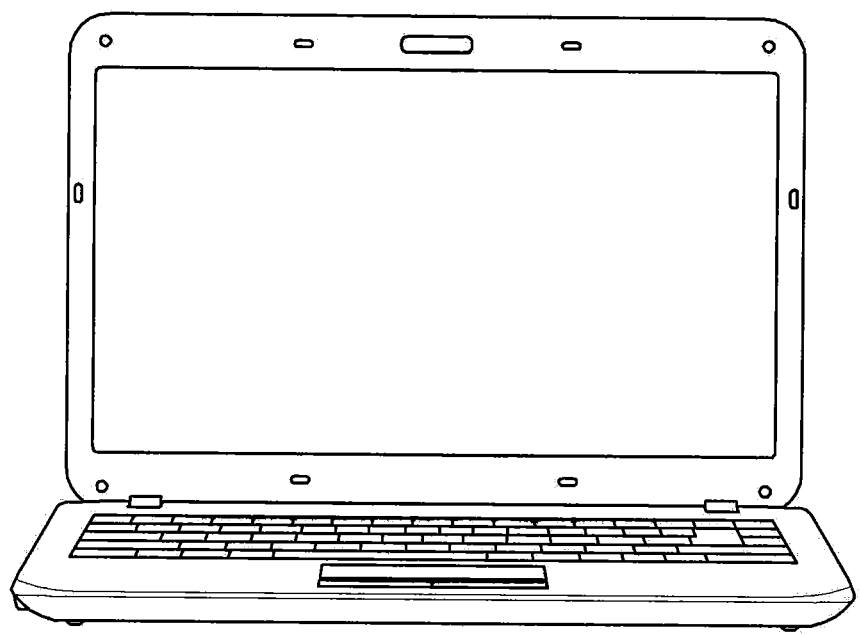

FIGS. 24 and 25 are exemplary views of a semiconductor system to which the semiconductor device according to some embodiments of the present invention can be applied. FIG. 24 illustrates a tablet PC, and FIG. 25 illustrates a notebook PC. At least one of the semiconductor devices 1 to 8 according to the embodiments of the present invention may be used in the tablet PC or the notebook PC. It is apparent to those of skilled in the art that the semiconductor device according to some embodiments of the present invention can be applied to other integrated circuit devices that have not been exemplified.

Although embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
   a substrate having a lower surface that extends in a first direction and in a second direction that is perpendicular to the first direction;
   first and second active fins that project upwardly from an upper surface of the substrate in a third direction that is perpendicular to both the first and second directions, the first and second active fins extending in the first direction and being spaced apart from each other along the second direction;
   a field insulating film on the upper surface of the substrate between the first and second active fins; and
   a first gate structure on an upper surface of the field insulating film, the first gate structure extending in the second direction to cross the first and second active fins,
   wherein the field insulating film includes a first recessed region adjacent the first active fin, a second recessed region adjacent the second active fin, and a third region that is between the first and second recessed regions, the third region having a thickness in the third direction that exceeds the average thicknesses in the third direction of the respective first and second recessed regions, and
   wherein a first length of the first recessed region in the second direction is less than a third length of the third region in the second direction and a second length of the second recessed region in the second direction is less than the third length of the third region in the second direction,
   wherein a width of a lower portion of the first active fin in the second direction is greater than or equal to a width of an upper portion of the first active fin in the second direction, a width of a lower portion of the second active fin in the second direction is greater than or equal to a width of an upper portion of the second active fin in the second direction, and the first gate structure directly contacts sidewalls of the first and second active fins.

2. The semiconductor device of claim 1, wherein the third length of the third region in the second direction exceeds a length of the first active fin in the second direction.

3. The semiconductor device of claim 1, wherein the third region has a substantially flat upper surface, and wherein the first gate structure includes a first metal gate.

4. The semiconductor device of claim 1, the semiconductor device further comprising a second gate structure on the upper surface of the substrate, the second gate structure extending in the second direction to cross the first and second active fins, the second gate structure being spaced apart from the first gate structure along the first direction, wherein the first and second gate structures include respective first and second metal gates.

5. The semiconductor device of claim 4, further comprising a dummy metal gate that extends in the second direction to cross end portions of the first and second active fins, a portion of the dummy metal gate that is between the first and second active fins having a different shape than a portion of the first gate structure that is between the first and second active fins.

6. The semiconductor device of claim 3, further comprising a spacer on opposed sides of the first gate structure.

7. The semiconductor device of claim 6, wherein the first gate structure includes a gate insulating film that extends upwardly along respective inner sidewalls of the spacer between each inner sidewall of the spacer and a metal gate of the first gate structure.

8. The semiconductor device of claim 3, wherein a first portion of the first gate structure that is above the first recessed region of the gate insulating film has a first thickness in the third direction, a second portion of the first gate structure that is above the second recessed region of the gate insulating film has a second thickness in the third direction and a third portion of the first gate structure that is above the third region of the gate insulating film has a third thickness that exceeds the first thickness and the second thickness.

9. The semiconductor device of claim 6, further comprising a source region in the first active fin on a first side of the first gate structure and a drain region in the first active fin on a second, opposite side of the first gate structure, wherein upper surfaces of the source region and the drain region are on respective sidewalls of the spacer.

10. A semiconductor device comprising:
    first and second active fins that project from a substrate in a first direction;
    a field insulating film on an upper surface of the substrate between the first and second active fins;
    a metal gate structure on the field insulating film that crosses over the first and second active fins, the metal gate structure on upper surfaces and opposed sidewalls of the first and second active fins; and
    a spacer on at least one side of the metal gate structure,
    wherein the field insulating film includes a first recessed region that is adjacent the first active fin that has a first minimum thickness, and a second region that is spaced apart from the first active fin and from the second active fin that has a second thickness that exceeds the first minimum thickness, and
    wherein the metal gate structure includes a gate insulating film extending in the first direction along side walls of the spacer,
    wherein the metal gate structure extends in a second direction, and wherein a length of the second region of the field insulating film in the second direction exceeds a length of the first active fin in the second direction and exceeds a length of the first recessed region of the field insulating film in the second direction,
    wherein the first active fin extends in a third direction that is perpendicular to the first and second directions, the semiconductor device further comprising a dummy metal gate that is disposed at an end portion of the first active fin.

11. The semiconductor device of claim 10, wherein the metal gate structure disposed above the first recessed region of the gate insulating film has a maximum thickness that exceeds a thickness of the metal gate structure that is disposed above the second region of the gate insulating film.

12. The semiconductor device of claim 10, wherein a width of a lower portion of the first active fin in the second direction is greater than or equal to a width of an upper portion of the first active fin in the second direction, a width of a lower portion of the second active fin in the second direction is greater than or equal to a width of an upper portion of the second active fin in the second direction, and the field insulating film directly contacts sidewalls of the first and second active fins.

13. The semiconductor device of claim 10, wherein a shape of the metal gate structure and a shape of the dummy metal gate are different from each other.

14. The semiconductor device of claim 10, wherein the metal gate structure comprises a first metal gate structure, the semiconductor device further comprising a second metal gate structure on the upper surface of the substrate, the second metal gate structure extending in the second direction to cross the first and second active fins, the second metal gate structure being spaced apart from the first metal gate structure along a third direction that is perpendicular to the second direction.

15. The semiconductor device of claim 10, further comprising a source region and a drain region formed at the first active fin on opposite sides of the metal gate structure, upper surfaces of the source region and the drain region are higher above a lower surface of the substrate than is a lower surface of the metal gate structure.

16. A semiconductor device comprising:
a substrate having a lower surface that extends in a first direction and in a second direction that is perpendicular to the first direction;
first and second active fins that project in a third direction from the substrate and that extend along the substrate in the first direction, the third direction being perpendicular to the first and second directions;
a field insulating film between the first and second active fins;
a first gate structure on the field insulating film and the first and second active fins, the first gate structure extending in the second direction;
a source region and a drain region formed at the first active fin on opposite sides of the first gate structure,
a second gate structure on the field insulating film and the first and second active fins, the second gate structure extending in the second direction and spaced apart from the first gate structure in the first direction;
wherein a first thickness in the third direction of a first portion of the first gate structure that is adjacent the first and second active fins is larger than a second thickness in the third direction of a second portion of the first gate structure that is disposed in a central region between the first and second active fins, and
wherein a portion of the second gate structure that is between the first and second active fins has a different shape than a portion of the first gate structure that is between the first and second active fins.

17. The semiconductor device of claim 16, further comprising a spacer that is disposed on opposed sides of the gate structure, and parts of the source region and the drain region extend onto respective lower sidewalls of the spacer.

18. The semiconductor device of claim 16, wherein the first portion of the gate structure is positioned above a first recessed region of the field insulating film and the second portion of the gate structure is positioned above a second non-recessed region of the field insulating film, and wherein a length of the first portion of the structure in the second direction exceeds a length of the first active fin in the second direction and exceeds a length of the first recessed region of the field insulating film in the second direction.

19. The semiconductor device of claim 16, wherein the second gate structure comprises a dummy metal gate, and the portion of the second gate structure that is between the first and second active fins has a substantially constant thickness.

20. The semiconductor device of claim 16, wherein a width of a lower portion of the first active fin in the second direction is greater than or equal to a width of an upper portion of the first active fin in the second direction, a width of a lower portion of the second active fin in the second direction is greater than or equal to a width of an upper portion of the second active fin in the second direction, and the gate structure directly contacts sidewalls of the first and second active fins.

* * * * *